United States Patent
Langer et al.

(12)

(10) Patent No.: US 9,189,458 B1
(45) Date of Patent: Nov. 17, 2015

(54) PARAMETER ESTIMATION

(71) Applicant: Xilinx, Inc., San Jose, CA (US)

(72) Inventors: Jan Langer, Dublin (IE); Baris Ozgul, Dublin (IE); Juan J. Noguera Serra, Dublin (IE)

(73) Assignee: XILINX, INC., San Jose, CA (US)

( * ) Notice: Subject to any disclaimer, the term of this patent is extended or adjusted under 35 U.S.C. 154(b) by 344 days.

(21) Appl. No.: 13/785,135

(22) Filed: Mar. 5, 2013

(51) Int. Cl.
 *G06F 7/32* (2006.01)
 *G06F 17/16* (2006.01)

(52) U.S. Cl.
 CPC ..................................... *G06F 17/16* (2013.01)

(58) Field of Classification Search
 CPC . G06F 17/16; G06F 15/8076; G06F 15/8092; G06F 7/4806; G06F 9/30036
 USPC ......................................... 708/520, 514, 607
 See application file for complete search history.

(56) References Cited

U.S. PATENT DOCUMENTS

| | | | | |
|---|---|---|---|---|
| 4,914,615 A | * | 4/1990 | Karmarkar et al. | 708/607 |
| 2005/0197977 A1 | * | 9/2005 | Buck et al. | 706/12 |
| 2006/0064452 A1 | * | 3/2006 | Nakanishi | 708/607 |
| 2006/0112159 A1 | * | 5/2006 | Sakaguchi et al. | 708/490 |

* cited by examiner

*Primary Examiner* — Tan V. Mai
(74) *Attorney, Agent, or Firm* — W. Eric Webostad

(57) ABSTRACT

An apparatus relating generally to generation of a compressed matrix is disclosed. In this apparatus, a row determination block is coupled to receive input samples and configuration information and is configured to provide a row output for each of the input samples. A matrix determination block is coupled to receive the row output and the configuration information. The matrix determination block is configured to: generate pivot row indices responsive to the configuration information; generate each outer product using the row output and any of the pivot row indices therefor; and accumulate, for each of the input samples, the outer product therefor for inclusion in the compressed matrix.

20 Claims, 12 Drawing Sheets

PARAMETER ESTIMATION

TECHNICAL FIELD

The following description relates to integrated circuit devices ("ICs"). More particularly, the following description relates to a parameter estimator for an IC.

BACKGROUND

Digital Pre-Distortion ("DPD") is a signal processing technique, which is widely used to mitigate nonlinearity effects of power amplifiers, such as for example in third and fourth generation wireless transmitters. DPD is used to precondition an input signal to counter nonlinearity effects of a power amplifier ("PA") in wireless systems, so output of the power amplifier is more linear than without such DPD of the input signal. Generally, it is more cost effective to digitally predistort an input signal to a power amplifier than to make the power amplifier output linear over a wide bandwidth of operation. Some of such wireless transmitters support Multiple-Input, Multiple-Output ("MIMO") operation in combination with spatial multiplexing, such as for example in various wireless communication specifications including 3GPP LTE and IEEE 802.11n. Thus, multiple antennas may be used for transmitting in such systems.

A DPD system may include of a filter that predistorts data samples ("samples") prior to input to a PA, and a parameter estimator, coupled as part of a feedback path from an output of such PA to a digital predistorter ("predistorter") for digital predistortion may be used to update predistortion coefficients used by such predistorter. Unfortunately, during operation, such parameter estimator, in order to quickly adapt predistortion coefficients to changing conditions of such PA, parameters associated with large matrices are regularly updated, which is resources intensive in order to meet such changing conditions. Faster updating for a wireless system may translate into supporting more antennas. Along those lines, it is better to have low update times to allow support for more antennas using one parameter estimator. To obtain such low update times, heretofore complexity of a predistorter has been increased by increasing the number of parameters (i.e., the number of coefficients) processed. However, this may add cost and/or increase power consumption.

Accordingly, it would be useful to provide for lower update times while avoiding one or more of the issues associated with more complex parameter estimators.

SUMMARY

An apparatus relates generally to generation of a compressed matrix. In such an apparatus, a row determination block is coupled to receive input samples and configuration information and is configured to provide a row output for each of the input samples. A matrix determination block is coupled to receive the row output and the configuration information. The matrix determination block is configured to: generate pivot row indices responsive to the configuration information; generate each outer product using the row output and any of the pivot row indices therefor; and accumulate, for each of the input samples, the outer product therefor for inclusion in the compressed matrix.

A method relates generally to determination of predistortion coefficients. In such a method, input samples and configuration information is obtained by a parameter estimator. The parameter estimator is coupled to a power amplifier and a digital predistorter. The parameter estimator: generates row outputs respectively for the input samples; determines pivot row indices from the configuration information; generates conjugates of the row outputs to provide columns; selects pivot elements, from either the row outputs prior to generation of the conjugates or the columns responsive to the pivot row indices associated therewith, to constitute each of the columns; multiplies the columns respectively with the row outputs associated therewith to provide outer products for inclusion in a compressed matrix; assembles the compressed matrix with the outer products; reconstructs a V matrix from the compressed matrix; corrects non-zero delay factors in the V matrix to provide a matrix V; determines the predistortion coefficients using the matrix V; and outputs the predistortion coefficients to the digital predistorter.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 4-1 is a table diagram depicting an exemplary matrix U.

FIG. 4-2 is the table diagram of FIG. 4-1 depicting matrix U with some alphabetic symbols added to some of the elements or cells of some rows to generally indicate values in such rows for purposes of visualization.

FIGS. 5-1 and 5-4 are table diagrams depicting respective formations of a matrix V with associated determination regions.

DETAILED DESCRIPTION

Figure 1:
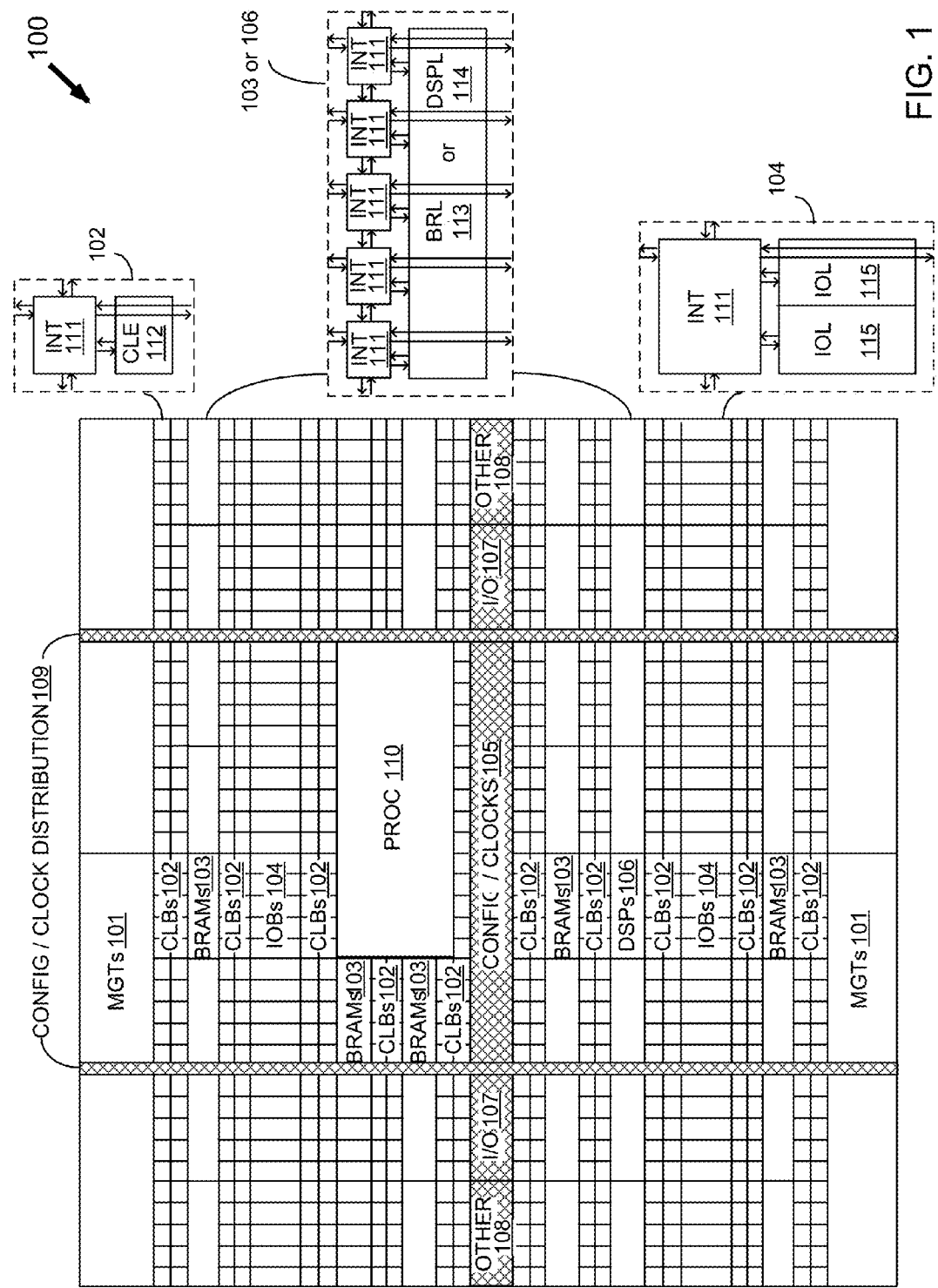
FIG. 1 is a simplified block diagram depicting an exemplary columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Some portions of the detailed descriptions that follow are presented in terms of algorithms and symbolic representations of operations on data bits within a memory, a register, or other hardware circuitry. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those involving physical manipulations of physical quantities. Usually, though not necessarily, these quantities take the form of optical, electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, or a central processing unit, whether embedded or not and/or whether a single core or multicore, or a digital signal processor, or programmable resources or other resources of a field programmable system-on-chip or programmable logic device, and/or one or more other ICs or systems, that may be used to manipulate and/or transform data represented as physical (electronic) quantities within registers, memories and/or other information storage devices thereof into other data similarly represented as physical quantities within registers, memories and/or other information storage devices thereof for transmission, display, and/or otherwise outputting or using a result from such manipulation and/or transformation of data.

Concepts described herein may be embodied as apparatus, method, system, or computer program product. Accordingly, one or more of such examples may take the form of an entirely hardware example, an entirely software example (including firmware, resident software, and micro-code, among others) or an example combining software and hardware, and for clarity any and all of these examples may generally be referred to herein as a "block", "circuit," "module," "system," or other suitable terms. Furthermore, such examples may be of the form of a computer program product on a computer-usable storage medium having computer-usable program code in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory ("RAM"), a read-only memory ("ROM"), an erasable programmable read-only memory ("EPROM" or Flash memory), an optical fiber, a portable compact disc read-only memory ("CD-ROM"), an optical storage device, a non-transitory media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer usable program code may be transmitted using any appropriate medium, including but not limited to the Internet, wireline, optical fiber cable, radio frequency ("RF") or other means.

Computer program code for carrying out operations in accordance with concepts described herein may be written in an object oriented programming language such as Java, Smalltalk, C++ or the like, for example. However, the computer program code for carrying out such operations may be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network ("LAN") or a wide area network ("WAN"), or the connection may be made to an external computer (for example, through the Internet using an Internet Service Provider).

Systems and methods described herein may relate to an apparatus for performing the operations associated therewith. This apparatus may be specially constructed for the purposes identified, or it may include a general-purpose computer selectively activated or reconfigured by a computer program stored in the computer.

Notwithstanding, the algorithms and displays presented herein are not inherently related to any particular computer or other apparatus. Various general-purpose systems may be used with programs in accordance with the teachings herein, or it may prove convenient to construct a more specialized apparatus to perform the operations. In addition, even if the following description is with reference to a programming language, it should be appreciated that any of a variety of programming languages may be used to implement the teachings as described herein.

One or more examples are described below with reference to flowchart illustrations and/or block diagrams of methods, apparatus (including systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the Figures illustrate the architecture, functionality, and operation of possible implementations of apparatuses (including systems), methods and computer program products according to various examples. In this regard, each block in the flowchart or block diagrams may represent a block, module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

It should be understood that although the flow charts provided herein show a specific order of operations, it is understood that the order of these operations may differ from what is depicted. Also two or more operations may be performed concurrently or with partial concurrence. Such variation will depend on the software and hardware systems chosen and on designer choice. It is understood that all such variations are within the scope of the disclosure. Likewise, software and web implementations may be accomplished with standard programming techniques with rule based logic and other logic to accomplish the various database searching operations, correlation operations, comparison operations and decision operations. It should also be understood that the word "component" as used herein is intended to encompass implementations using one or more lines of software code, and/or hardware implementations, and/or equipment for receiving manual inputs.

Parameter estimation for digital pre-distortion ("DPD") is used in 3G and 4G wireless systems. Such parameter estimation conventionally involves a very large matrix multiplication. To reduce such computation effort, only a subset of elements in a matrix is determined. Only a subset of such elements may be used for exploiting redundancy in multiplication of input matrices to provide a reduced or compressed matrix. This reduced complexity expedites parameter estimation. Such compressed matrix is reconstruction toward restoring an original matrix, and a reconstructed matrix is corrected to obtain a complete version of such original matrix.

Computation or determination time of such large matrix may be improved by a factor of two to three as compared with a typical DPD parameter estimator. However, with an increasing number of memory terms in a Volterra series, even higher speed-up factors may be achieved. Hence, this reduction in computation time significantly reduces overall update time of DPD parameter estimation. With the above general understanding borne in mind, various embodiments for parameter estimation and a parameter estimator are described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
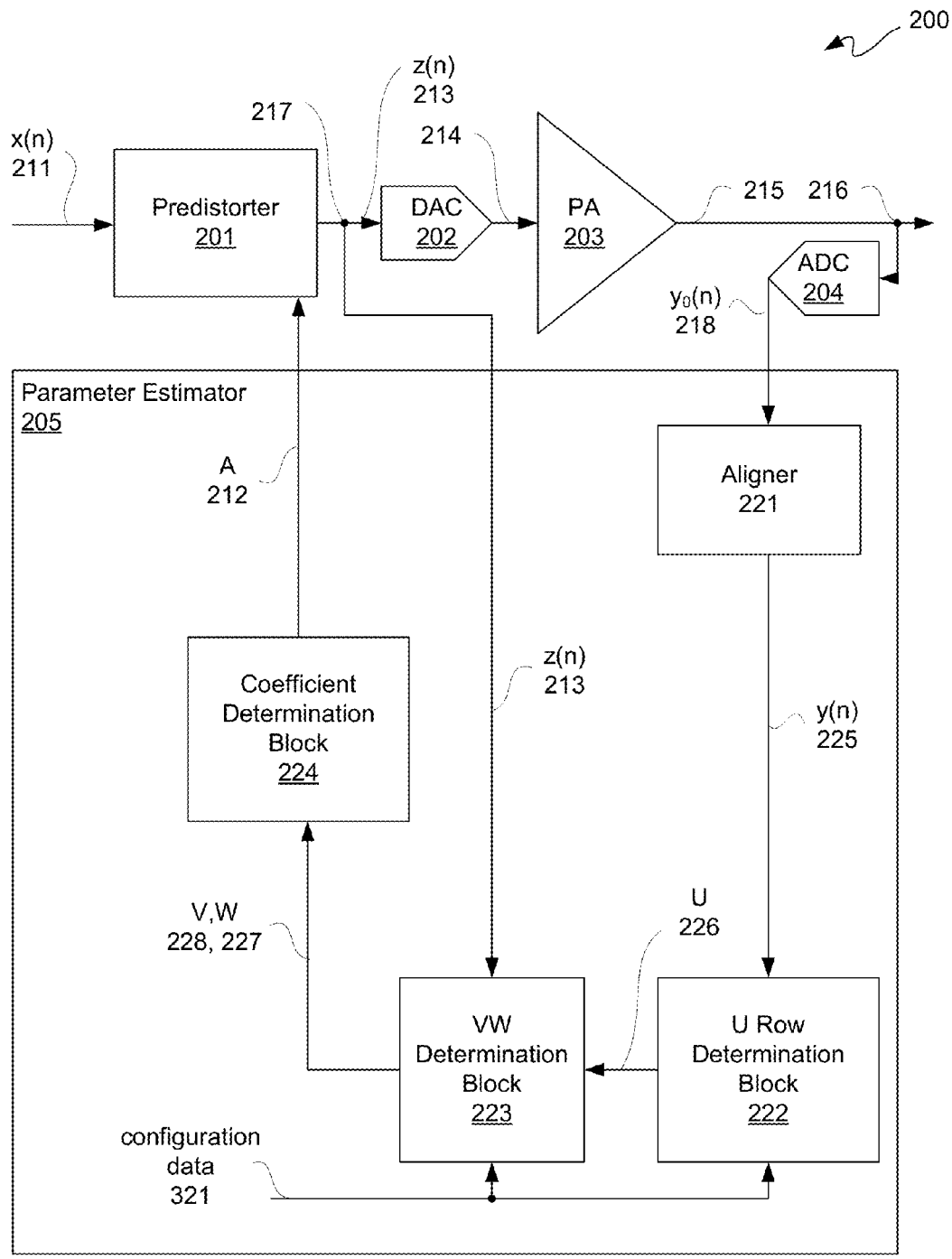
FIG. 2 is a block/circuit diagram depicting an exemplary transmitter system.

FIG. 2 is a block/circuit diagram depicting an exemplary transmitter system 200. Transmitter system 200 includes predistorter 201, digital-to-analog converter ("DAC") 202, power amplifier ("PA") 203, analog-to-digital converter ("ADC") 204, and parameter estimator ("estimator") 205. ADC 204 and estimator 205 may both be parts of a feedback path to predistorter 201. Even though single lines are illustratively depicted throughout the several figures herein, each of such lines may represent one or more signal lines, and thus are shown as individual signal lines for purposes of clarity and not limitation.

A data input signal x(n) 211 is provided as n digital data samples to predistorter 201. Predistorter 201 is configured for DPD, and thus uses predistortion coefficients A or predistortion coefficient matrix A 212, which coefficients are provided as a feedback input to predistorter 201. Predistorted output z(n) 213 of predistorter 201 is provided as n predistorted digital samples for input to DAC 202. Analog output 214 of DAC 202 is provided for input to PA 203. Amplified analog output 215 of PA 203 may be provided to antennas for transmission.

Such amplified analog output 215 to be transmitted is further tapped at output node 216 for input to ADC 204. Digital output $y_0(n)$ 218 is provided as an input to an alignment block or an aligner 221 of parameter estimator 205. Furthermore, output node 217 of predistorter 201 is tapped to provide predistorted output z(n) 213 as an input to VW determination block 223 of estimator 205. VW determination block 223, as well as U row determination block 222, may be coupled to receive configuration information, such as for example configuration data 321, as described below in additional detail.

Estimator 205, in addition to aligner 222 and VW determination block 223, includes U row determination block 222 and coefficient determination block 224. VW determination block 223 and U row determination block 222 may include hardware, such as for example memory or other storage, DSP blocks, microprocessor cores, a digital signal processor, and/or a general-purpose processor, or other circuitry, which may be configured to perform operations as described herein. Even though examples of hardware are provided, one or more operations of VW determination block 223 and U row determination block 222 may be performed by software or a combination of hardware and software. For purposes of clarity by way of example and not limitation, it shall be assumed that estimator 205 is formed using resources of FPGA 100 of FIG. 1, as an FPGA and/or one or more other ICs may be used to provide an estimator 205.

Aligned output y(n) 225 from aligner 221 is provided as an input to U row determination block 222. Aligned output y(n) 225 may be a sequence of n digital data samples of amplified analog output y 215. Output of U row determination block 222 is matrix U row output ("matrix U row") 226. Matrix U row 226 is provided as an input to VW determination block 223 along with predistorted output z(n) 213. Output of VW determination block 223 is a vector W output 227 and matrix V output ("matrix V") 228. A matrix U, namely composed of matrix U rows 226, may be a series of matrix samples, or more particularly a Volterra series matrix of n samples $y_n$; matrix V may be an autocorrelation matrix; and vector W may be a cross-correlation vector. Vector W output 227 and matrix V 228 are provided as inputs to coefficient determination block 224 for generation of updated DPD coefficients, namely predistortion coefficients A 212. Predistortion coefficients A 212 are output from coefficient determination block 224 for output from estimator 205 for input to predistorter 201.

Generally, VW determination block 223 outputs a vector W output 227 and a matrix V 228 from which predistortion coefficients A 212 are computed or otherwise determined. A V matrix determination portion of VW determination block 223 may be the most time-consuming task of estimator 205 for DPD coefficient updating. Calculating or otherwise determining matrix V 228 may consume up to approximately 90% of an overall coefficient update time of estimator 205.

VW determination block 223 may be configured to multiply predistorted output z(n) 213 with a matrix U row 226 to provide vector W output 227. This may be done for each matrix U row 226 for a set of input samples z(n) 213 to provide vector output W 227. Determination of matrix V 228 is separate from determination of vector W output 227.

Accordingly, for purposes of clarity, even though determination block 223 is referred to herein as VW determination block, determination block 223 may be configured as a V matrix determination block and a separate block may be configured to use inputs 213 and 226 to provide a W vector 227. Thus, generally, VW determination block 223 may be considered a matrix determination block for the remainder of this description.

Matrix V 228 may be a product of an (n×l) matrix U with a Hermitian transpose of matrix U, namely matrix $U^H$, or mathematically stated $V=U^H \cdot U$. Along those lines a column of one of such matrices, such as matrix $U^H$, may be multiplied by a row of another of such matrices, such as matrix U, to obtain an "outer" product partial result. This means rather than storing an entire matrix U, a row-by-row output may be used, as generally indicated by matrix U row 226 output from U row determination block 222.

A resulting matrix V 228 may be of size (l×l). Matrix U row 226 may be derived from a sequence of n samples in power amplifier output y 215. Along those lines, conventionally determination of matrix V 228 involved $l^2$ storage elements or memory cells and $n \cdot l^2$ multiplication steps. However, as described below in additional detail, such complexity may be substantially reduced in order to lower DPD coefficient update times of estimator 205. For purposes of clarity, for now assume matrix U row 226 is a 1-by-n row, and according a Hermitian transpose of such matrix U row 226 is an n-by-1 column.

A property of determination of matrix V 228 is Hermitian, and so matrix V 228 is its own Hermitian transpose. As is known, only an upper triangular half of a Hermitian matrix may be calculated or otherwise determined, as its lower triangular half can be derived from such determined upper triangular half, or vice versa. Memory storage used for calculating or otherwise determining matrix V 228 may therefore be reduced to approximately $$\frac{l \cdot (l+1)}{2},$$

and runtime for calculating or otherwise determining matrix V 228 may be reduced to approximately $$\frac{n \cdot l \cdot (l+1)}{2},$$

which corresponds to half the number of elements in a completely resolved matrix V 228. As this improvement and determining matrix V 228 is well-known leading to memory and runtime improvement of roughly a factor of two, it is not described herein in unnecessary detail. For purposes of clarity by way of example not limitation, it shall be assumed that an upper right triangular half is determined in order to derive a lower left triangular half therefrom.

However, additional redundancy in matrix V 228 has been identified, and such additional redundancy may be determined so as to further reduce memory or other storage usage, as well as further reducing runtime, for determination of matrix V 228. This additional redundancy in matrix V 228 may generally be attributed to two sources. A first of such sources is associated with the aforementioned Hermitian property used in determining matrix V 228, and a second of such sources is inherent in matrix U which may be used to improve determination of matrix V 228. With respect to the latter of these sources, most of the elements in matrix U may be copies of elements from a previous row, as described below in additional detail. By exploiting these two sources of redundancy, an improvement in runtime and a reduction in memory or storage ("memory") needs for determination of matrix V 228 may generally be a factor of M, where M represents a number of memory terms in a Volterra series. Along those lines, memory usage for determination of matrix V 228 may be approximately $$\frac{l^2}{M}$$

memory elements ("cells"), and runtime of VW determination block 223 for determination of matrix V 228 may be associated with approximately $$\frac{n \cdot l^2}{M}$$

operations. If the number of memory terms M is greater than the improvement of two from the Hermitian property as previously described, then parameter estimation as described below in additional detail is more efficient for either or both memory usage and runtime than conventional approaches. Such improved efficiency may be present even with post-processing operations of an in-process version of matrix V 228, as described below in additional detail. In particular, such post-processing operations involve reconstruction of an upper triangular half of matrix V 228 and a subsequent in-place correction operation. Such reconstruction may have a runtime of approximately $$\frac{l \cdot (l+1)}{2}$$

operations, and such correction may have a runtime of approximately $$2(M-1) \cdot \frac{l \cdot (l+1)}{2}$$

operations. Because n is much larger than M, runtime of reconstruction and correction operations may be negligible.

Figure 3:
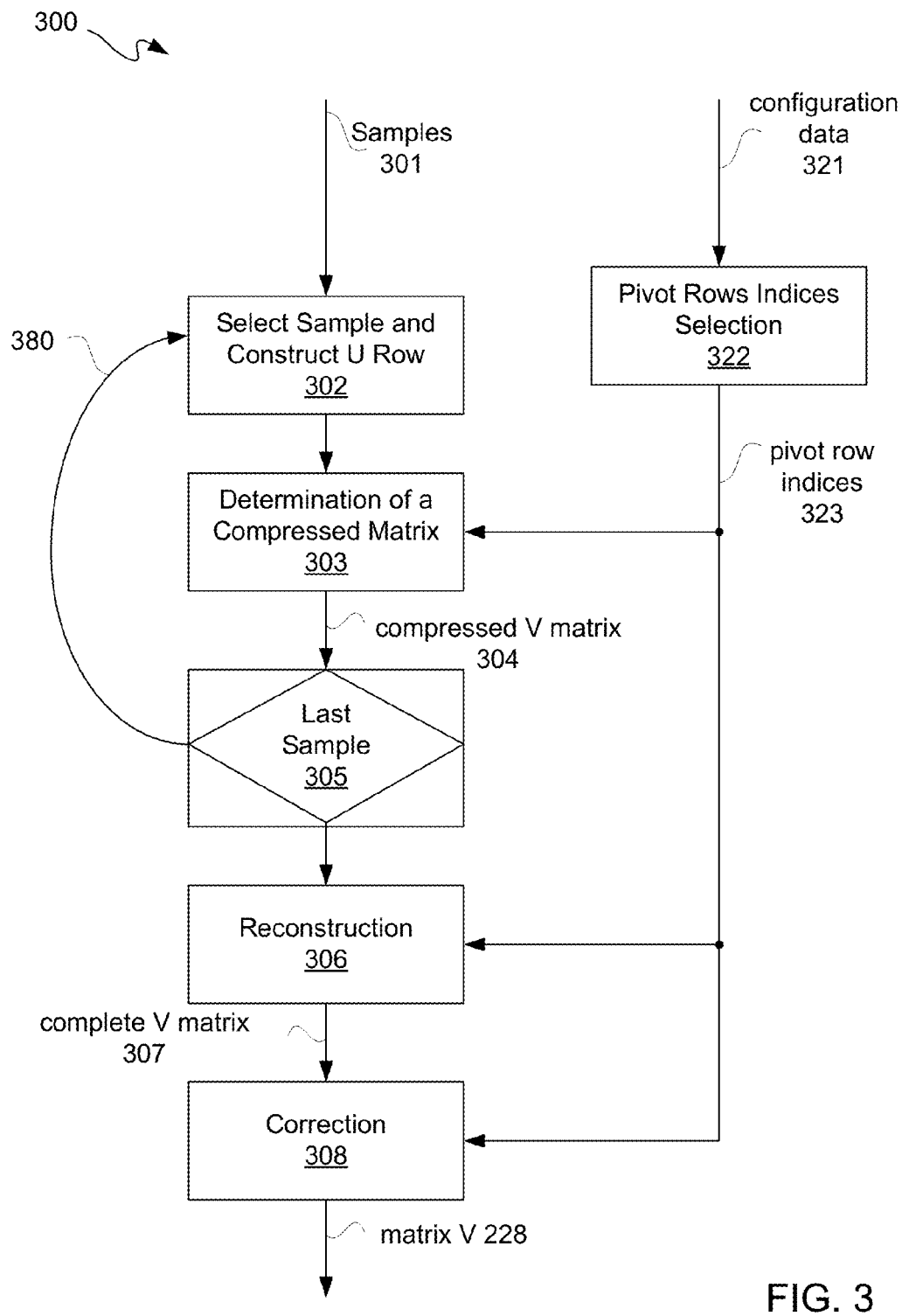
FIG. 3 is a flow diagram depicting an exemplary parametric estimation process.

FIG. 3 is a flow diagram depicting an exemplary parametric estimation process 300. Parametric estimation process 300 may be for VW determination block 223 of FIG. 2. Accordingly, parametric estimation process 300 is further described with simultaneous reference to FIGS. 2 and 3. Parametric estimation process 300 may be used as part of determining coefficients A 212 for DPD.

However, before detailed description of parametric estimation process 300, a more detailed description of an input to such parametric estimation process 300 is described involving computing or otherwise determining an (n×l) matrix U=f(y) from a vector of complex samples y(n), for y=($y_0$, $y_1$, ..., $y_{n-1}$), namely determining a matrix U row 226 from an aligned output y(n) 225.

Generally, length or depth (i.e., rows) of matrix U is n, namely a number n of samples, and width (i.e., columns) of matrix U is a number l of other terms, such as DPD coefficients or other coefficients for example. For purposes of clarity by way of example, samples n may be 1000 or more samples, where a number l of DPD coefficients may be less than 200. Even though other numbers may be used, it should be appreciated that generally there are substantially more samples than coefficients, and thus matrix U is generally a non-square or "long and narrow" matrix. So, matrix U is not Hermitian; however, a Hermitian transpose of matrix U may be determined in a known manner.

Along those lines, an element of a matrix U may be calculated or otherwise determined as:

$$U(t,k)=|y(t-m-r)|^p \cdot y(t-m), \quad (1)$$

where t is used as a row index of matrix U, and where k is a column index defined by three parameters (r, m, p) (i.e., k=(r, m, p)) of matrix U (i.e., t is the row and k is the column). Parameters r, m, and p of Equation (1) respectively generally represent diagonal/off-diagonal terms, memory terms, and polynomial contributions of a Volterra series. For r=0, such terms are diagonal terms, and for r=1, such terms are non-diagonal or off-diagonal terms. Which combinations of r, m and p are actually valid depends on configuration of a DPD solution space. Generally, a set of valid parameter configurations K may be mathematically defined as:

$$K=\{k_0, k_1, \ldots, k_{l-1}\} \text{ with } k_i \in (r_i, m_i, p_i).$$

Parameter combinations may be sorted lexicographically; however, generally any order of parameter combinations may be used.

Figures 1, 4:
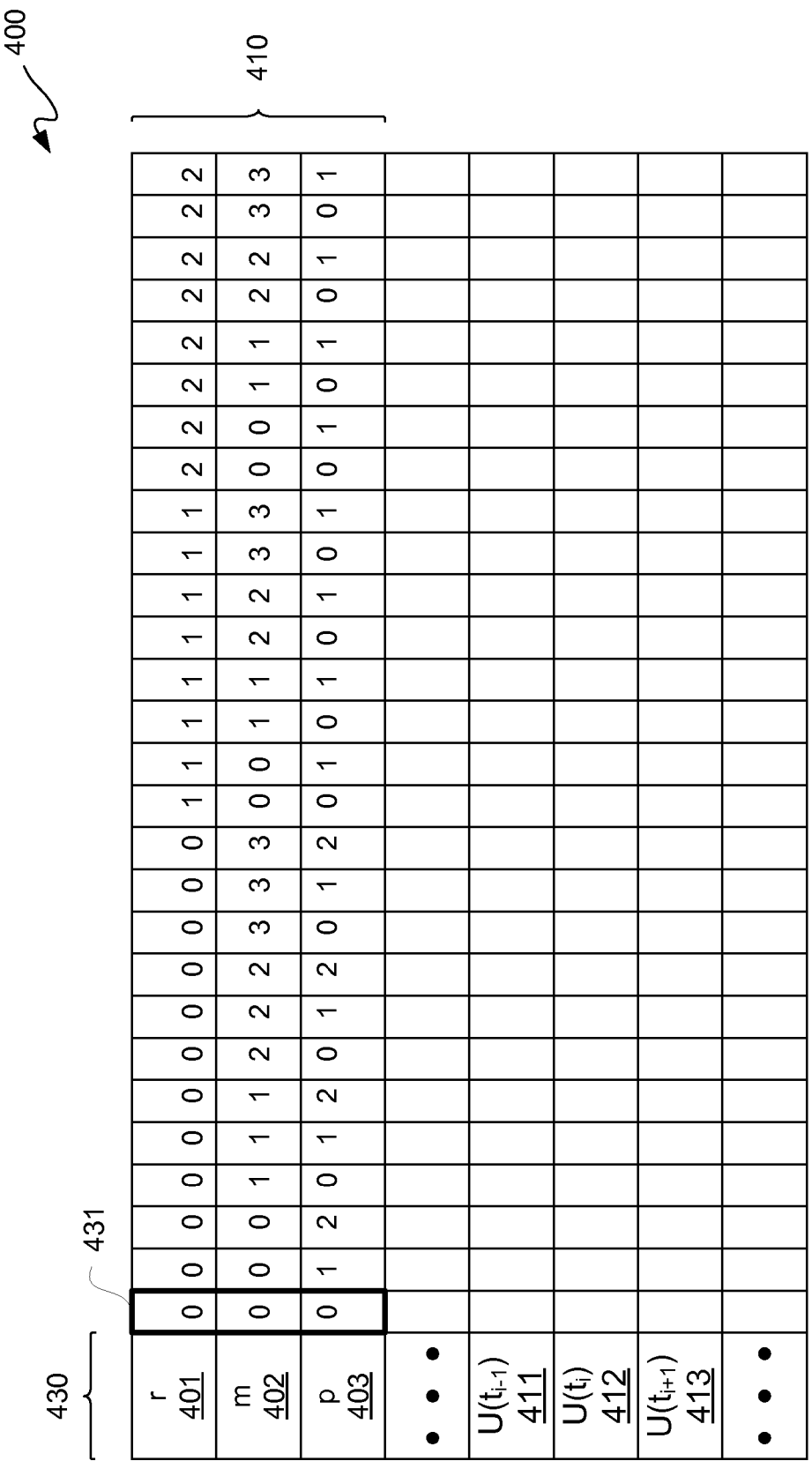
Figures 2, 4:
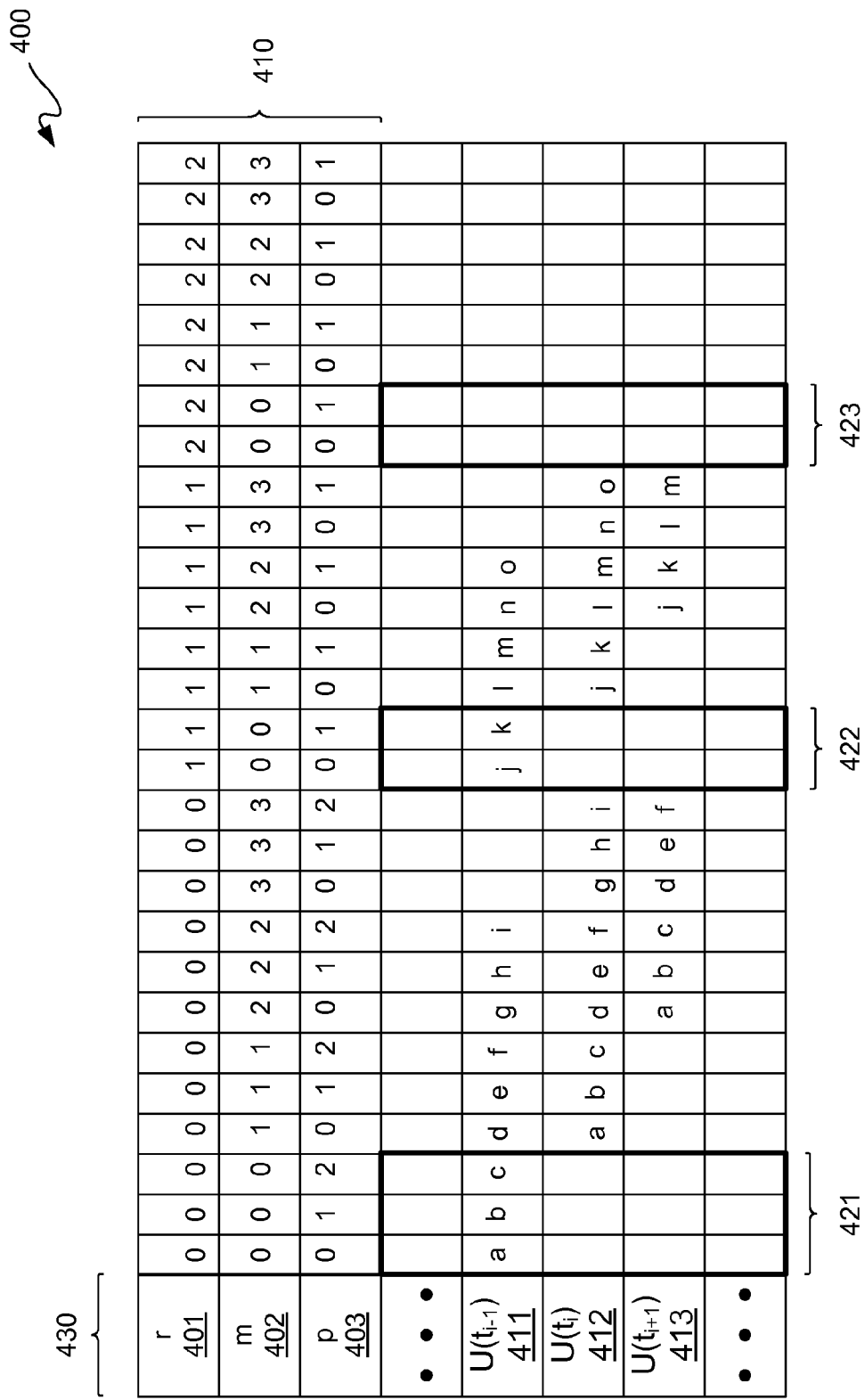

FIG. 4-1 is a table diagram depicting an exemplary matrix U 400. A notation $U(t_i)$ may be used to indicate a determination of a row vector $t_i$ of matrix U. Column 430 is not part of matrix U 400, but is used to identify elements in such matrix. Additionally, header rows 410 are not part of matrix U 400, but are used for determining values for such a matrix U.

An example of three rows 411 through 413, any of which may be a matrix U row 226 of FIG. 2, of matrix U 400 with example parameters for parameter combinations for r 401, m 402, and p 403 are located in header rows 410. A complete matrix U 400 may have n rows for n samples of a vector of complex samples y(n) 301, excluding three header rows 410, and may have l columns. In this example, a coefficients parameter l is 28; however, in other examples of U matrices, fewer or more than 28 coefficients may be used. Furthermore, DPD coefficients are described for purposes of clarity by way of example; however, other types of coefficients or more generally other types of values for a matrix may be used.

Matrix U 400 contains redundant elements in a sense, as some elements are copied from row-to-row as follows:

$$U(t,k)=U(t-q,k') \quad (2)$$

where k=(r, m, p) and where k'=(r,m−q,p). Along those lines, it may be stated that k'∈K is actually valid. Variable q may be a delay factor of this redundancy. In other words, k is a column index of matrix U, and k' is another column index of a matrix U where k' represents a set of valid parameter configurations of K having a delay factor q parameter. Thus, generally, for each column of a matrix U, there is a three-tuple, for example three-tuple 431, of r, m, p parameters that may be used to identify a column. Using Equation (1), each element of a selected, obtained, or given row t may be calculated or otherwise determined for a selected, obtained, or given k.

FIG. 4-2 is the table diagram of FIG. 4-1 depicting matrix U 400 with some alphabetic symbols added to some of the elements or cells of each of rows 411 through 413 to generally indicate values in rows 411 through 413 for purposes of visualization. All cells in each of rows 411 through 413 may have been populated with symbols. However, only a portion of such cells is illustratively populated for purposes of clarity in order to aid in visualizing duplicate values. Furthermore, alphabetical symbols may appear in order for convenience. However, such symbols need not be so ordered.

Same symbols in multiple cells of rows 411 through 413 of matrix U 400 represent same values. Because of this redundancy, only a portion of columns in a matrix U 400 may be determined, as any other values in other cells in such row may be derived from such portion of columns determined. In this example, such redundancy allows only groups of columns 421, 422, and 423, namely 7 of 28 columns, to be considered for determination, as any values in a remainder of such 28 columns may be derived from values in such 7 cells of each row considered. Some symbols may not appear in the example rows. For example, example symbols g, h, l only appear in row $U(t_i)$ 412, as they do not exist in row $U(t_{i-1})$ 411 or row $U(t_{i+1})$ 413.

Again, even though multiple rows of matrix U 400 are illustratively depicted, only one row at a time may be processed in accordance with Equation (1). Along those lines, only a portion of a matrix U 400 may be stored. In other words, rather than having to store all n rows for all l coefficients, only a single row of matrix U 400 may be stored at a time for processing. Furthermore, rather than having to store all l coefficients for a matrix U row 226 of FIG. 2, only a portion of such coefficients for a row may be stored corresponding to selected columns for determination of associated values, as the remaining coefficients in such a row may be derived. These select columns, namely columns 421 through 423 in this example, are where memory terms m are equal to zero. In short, only columns of a row where memory terms, m, are equal to zero may have to employ Equation (1) to calculate or otherwise determine each value for cells in such a row, and all other values in such row may be derived, such as copied to appropriate locations, from such calculated or otherwise determined values. From Equation (1), for terms where m is not equal to zero, such terms effectively are in the set of values already determined for m equal to zero, except shifted in a row being processed. In other words, returning to Equation (2), each cell's position may be determined by going back q increments in t and by going back q increments in m, for m greater than zero.

Thus, U row determination block 222, which may include memory or other storage, DSP blocks, a digital signal processor, microprocessor core(s), a general-purpose processor, and/or other circuitry, may be configured to determine and output a matrix U row 226 responsive to an input vector y(n) 225. Such circuitry may be parameterized with r, m, p to perform Equation (1) to determine all values of cells of a row, or such circuitry may be parameterized with r, m, p to perform Equation (1) to determine a subset of values for cells in a row with m equal to zero terms with remaining values of cells of such row provided by derivation as previously described. In either configuration, a matrix U row 226 may be output.

Returning to FIGS. 2 and 3, samples 301 may be a matrix U row 226 input to VW determination block 223. Recall that a matrix V 228 is obtained by $V=V^H \cdot U$. Along those lines, to obtain a Hermitian transpose of matrix U, a complete matrix U heretofore was stored prior to performing a multiplication.

In order to avoid storing a complete U matrix before starting with a matrix multiplication, matrix V 228 may be individually determined for each row of matrix U and such row-by-row increments may be accumulated as follows:

$$V=\Sigma_{t=0}^n V_t = \Sigma_{t=0}^n U(t)^H \cdot U(t). \quad (3)$$

Elements of $V_t$ may be computed or otherwise determined as follows:

$$V_t(k_x, k_y) = \overline{U(t,k_x)} \cdot U(t,k_y). \quad (4)$$

where $k_x=(r_x,m_x,p_x)$ and $k_y=(r_y,m_y,p_y)$, and where the bar such as above a $U(t,k_y)$ term, as well as used elsewhere herein, indicates a conjugate, or more particularly a complex conjugate. For example, a matrix V may be initialized with 0 values and then for each input row $U_i$ of matrix U, a result of a matrix multiplication, namely an "outer" product, of $U_i^H \cdot U_i$ may be added as a row to matrix V. An "outer" product of a column $U_i^H$ and a row $U_i$ results in a matrix $V_t$ that may be added to or row-by-row accumulated to form a matrix V; however, more efficiency in forming matrix V may be used, as described below in additional detail. VW determination block 223 may be configured to process only one row of matrix U, namely matrix U row 226, at a time, as processing more than one row of matrix U at a time need not be performed. Again, matrix V 228 is Hermitian, and thus only its upper triangular half may be determined. Furthermore, for a Hermitian matrix V 228, it holds that:

$$V(k_x,k_y)=\overline{V(k_y,k_x)}. \tag{5}$$

Redundancy in matrix U may also be present in matrix V 228. Along those lines, matrix $V_t(k_x, k_y)$ may be expressed as:

$$V_t(k_x,k_y)=\overline{U(t,k_x)} \cdot U(t,k_y)= \\ \overline{U(t-q,k'_x)} \cdot U(t-q,k'_y) = V_{t-q}(k_x',k_y'), \tag{6}$$

where $k'_x=(r_x,m_x-q,p_x)$ and $k'_y=(r_y,m_y-q,p_y)$.

To recapitulate, a matrix $V=U^H \cdot U$ is determined, where such matrix U contains Volterra series terms based on a PA output signal, and where matrix $U^H$ is a Hermitian transpose of matrix U. Even though this is described as complete matrices, this processing may be performed on a sample-by-sample basis, which is in effect a row-by-row basis. A sampling window of signals may yield a large number of samples. To avoid storing an entire matrix U, matrix multiplication is performed row-wise. A single cell of a row of matrix U, namely $U(t, k)$ may be determined for a kth position in row t using parameter column index arrays of a Volterra series. Every value of a matrix U on a row-by-row of matrix U row 226 output basis may be used in composing a compressed matrix, such as for example for a compressed matrix computation. However, when generating an outer product of $U_i^H$ and $U_i$ only pivot elements may be used in $U_i^H$, whereas all elements are used in $U_i$. Thus, more precisely, a compressed matrix $V=U^H \cdot U$ may be assembled and a value for each cell thereof determined for each matrix U row 226 output that is a pivot row, and from such a compressed matrix V an overall matrix V, which would follow from $V=U^H \cdot U$ for all rows in a matrix U, may be resolved. In other words, in generation of a matrix $V=U^H \cdot U$, a Hermitian transpose of a 1-by-n matrix U row 226 output may be used to provide a n-by-1 matrix $U^H$ column; however, in such n-by-1 matrix $U^H$ column only pivot terms, namely where $m=0$, may be considered. Thus, if there are p pivot terms in a n-by-1 matrix $U^H$ column, then a p-by-1 matrix $U^H$ column may be used instead of an n-by-1 matrix $U^H$ column. This means that in sample-by-sample processing to form a matrix $V=U^H \cdot U$ by accumulating results of such multiplications, namely by accumulating outer products, only pivot terms may be considered with respect to the Hermitian portion. Thus, a p-by-1 column multiplied by an 1-by-n row results in a p-by-n matrix portion, and such portions may be accumulated to form a compressed matrix V. To further reduce effort, prior to performing a Hermitian transpose, pivot row indices may be applied to reduce such 1-by-n row to provide a 1-by-p row, and then a Hermitian transpose may be performed on fewer elements, namely of such 1-by-p row, to provide such a p-by-1 column associated therewith.

Parametric variables t and m always occur together as the term t−m in Equation (1). This means that elements in row t have exactly the same value as elements in row t−m, but with m set to 0. In other words, many elements or values in a row are "delayed" elements or values from previous rows. This redundancy may be used to reduce computational effort or otherwise reduce effort of determining matrix V.

With continued reference to FIGS. 2 and 3, another input to VW determination block 223 may be configuration data 321. Configuration data 321 may be parameter variables to provide parameter column index arrays of a Volterra series, as previously described and described in additional detail below.

At 302, a sample of received samples 301 may be selected for processing. Furthermore, at 302, a matrix U row may be constructed for such sample selected. At 322, "pivot rows" may be identified or otherwise determined responsive to or from configuration data 321. At 322, "pivot row" indices 323 for such identified "pivot rows" may be determined or identified. Pivot rows may be used to correctly reconstruct an original V matrix 228. Pivot rows may be static information, as pivot rows generally do not change with each update cycle. Generally, pivot rows are rows where a memory parameter m for such row is equal to zero, and thus pivot row indices 323 may identify which rows are pivot rows as their row memory parameter m equals zero in configuration data 321. As shall be understood from the following description, a compressed V matrix may be constructed from pivot rows identified responsive to pivot row indices 323.

Pivot row indices 323 and samples 301, on a sample-by-sample basis, are provided for computation or other determination of a compressed matrix at 303 to output a compressed V matrix 304. In other words, as described above p-by-n matrices are generated on a sample-by-sample basis or row-by-row basis as previously described, and these p-by-n matrices or sub-matrices or output products are accumulated at 303 to provide a compressed V matrix 304. A compressed V matrix 304 is described below in additional detail. Assuming initialization of all values of a placeholder V matrix, for example initialization of all values to zero, then each sample of samples 301 is selected for construction of a matrix U row therefor, where pivot rows of such V matrix may be updated entirely. A resulting matrix, namely compressed V matrix 304, may contain only the necessary elements without redundancy or at least contain a substantially reduced number of elements with significantly less redundancy in order to reconstruct an original matrix V 228 for output. As shall be appreciated from the following description, there may be advantages to have at least some unnecessary elements or redundant elements in a resulting compressed V matrix 304.

In an example, all cells of each pivot row may be used to provide a compressed V matrix 304. In this example, determination of a compressed matrix at 303 may involve calculating or otherwise determining a value for each cell in each pivot row thereof. All rows not pivot rows may be ignored at 303 using pivot row indices 323 for this selection. Thus, if a sample of n samples is not for a pivot row, such sample may be ignored, and a next sample may be obtained assuming such ignored sample is not a last sample in a set of samples. Along these lines, a compressed V matrix 304 may be accumulated pivot row-by-pivot row, such that such compressed V matrix 304 may consist entirely of pivot rows. This is just one example for determination of a compressed matrix at 303, and other examples for output of other configurations of a compressed V matrix 304 follow from the following description.

To recapitulate, a matrix determination block 223, or operation at 303, a conjugate of a U row output 226 is calculated or otherwise determined. Such conjugate or Hermitian transposed column may be limited to pivot terms only responsive to pivot row indices. Such conjugate may be multiplied a matrix U row output 226 from which such conjugate was formed using only pivot terms thereof. Thus, on a sample-by-sample basis as associated with a row-by-row output, an outer product may be generated to provide a p-by-n sub-matrix, and such sub-matrices may be accumulated for inclusion in a compressed V matrix 304. Matrix determination block 223 or operation at 303 may be configured to matrix multiply each such Hermitian transpose of pivot terms with its corresponding U row output 226 for such row-by-row accumulation to resolve or output compressed V matrix 304. This output of a compressed V matrix may be done after all samples of n samples of a sampling window have been processed. Optionally, using pivot row indices 323, a look-ahead buffer may be used to determine whether loop 380 may be branched out of. However, for purposes of clarity and not limitation, it shall be assumed that each sample is processed without such a look-ahead operation.

At 305, it may be determined whether a last sample of n samples 301 has been processed for providing a completed compressed V matrix 304. If a last sample of a set of samples 301 has not been processed at 303 as determined at 305, then at 305 a sample count may be increment and such processing of samples may continue at 302. Along those lines, each sample of n samples 301, or alternatively stated each U row 226 of matrix U derived from a sample of n samples 301, may be processed one sample or one row at a time. If, however, it is determined at 305 that a last sample of a set of samples 301 has been processed at 303, a compressed V matrix 304 may be output or otherwise provided for reconstruction of a V matrix at 306.

At 306, compressed V matrix 304 and pivot row indices 323 are input and used to reconstruct a complete V matrix 307. Generally, a reconstruction operation copies values from pivot row locations to other locations in a V matrix where delayed versions of those values are stored. For example, this reconstruction may be done one time at the end of each sampling window n, namely after a last sample of a set of n samples has been processed as determined at 305.

At 308, a complete V matrix 307 and pivot row indices 323 are input and used for correction of such V matrix 307 to output a matrix V 228. Matrix V 228 may be exactly the same as without using a compressed V matrix as described herein. However, by using a compressed V matrix as described herein a substantial amount of processing overhead is avoided. Thus, update time for parameter estimation for DPD may be substantially reduced. To make the above description more concrete, some examples are described below in additional detail.

Figures 1, 5:
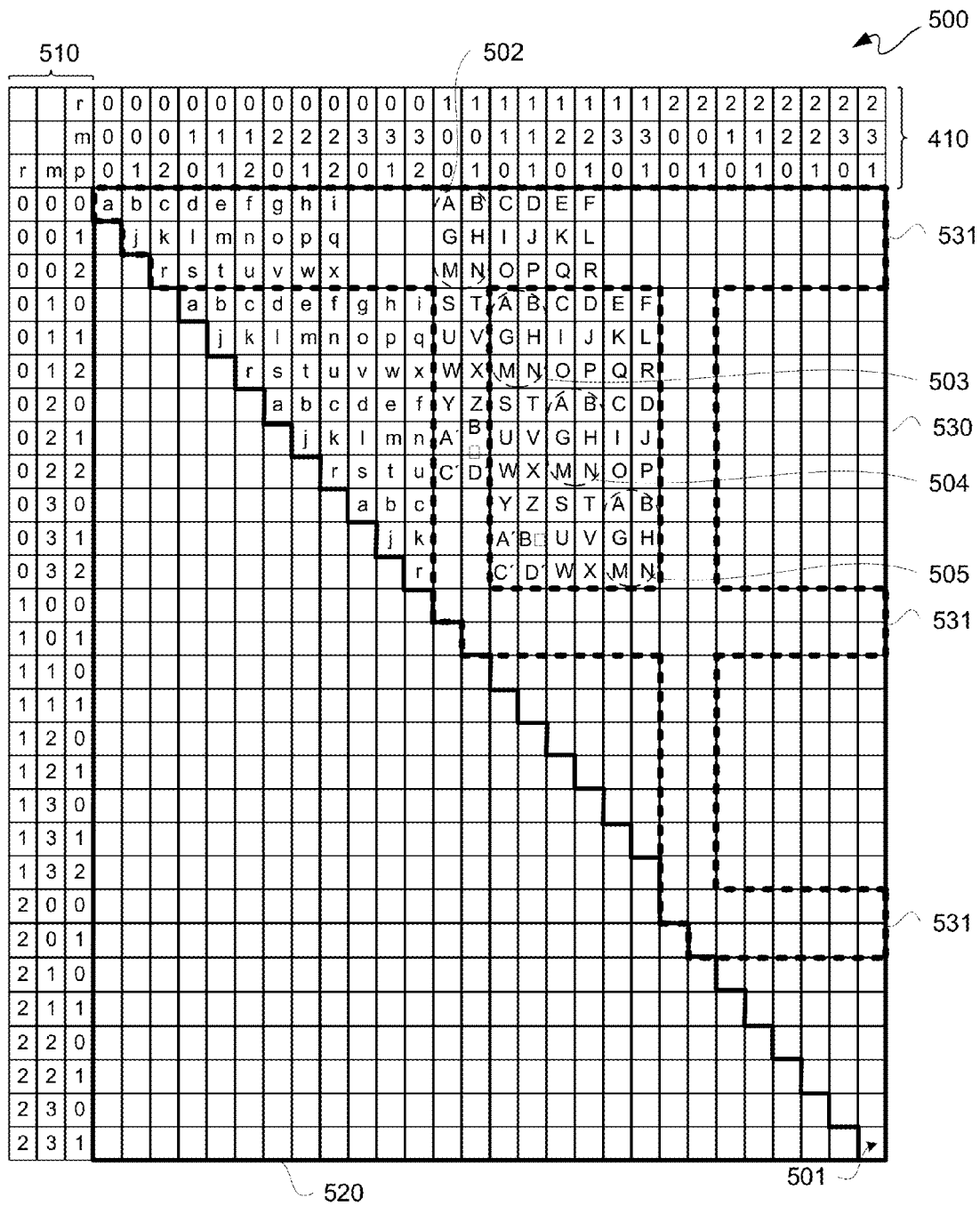
Figures 2, 5:
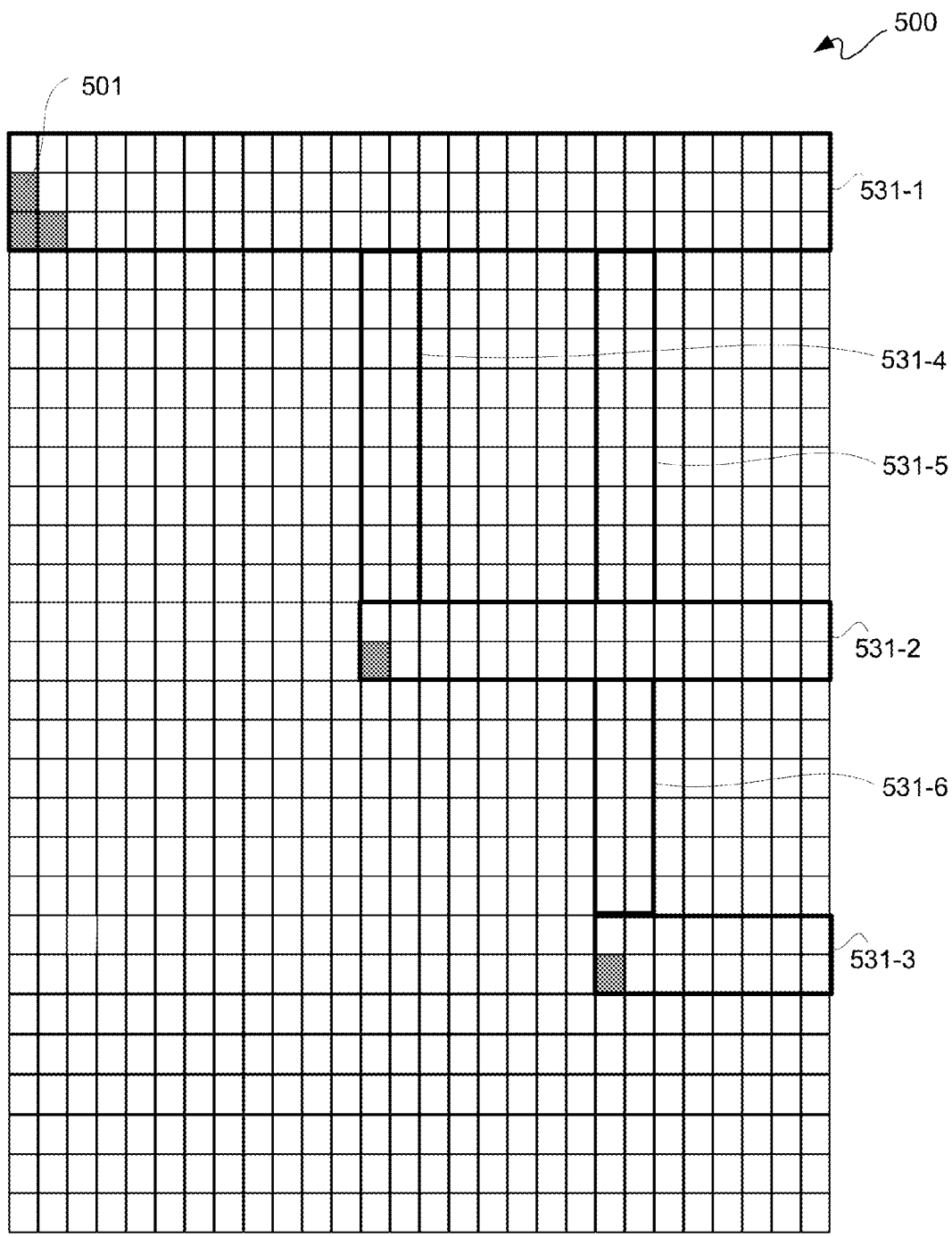
Figures 3, 5:
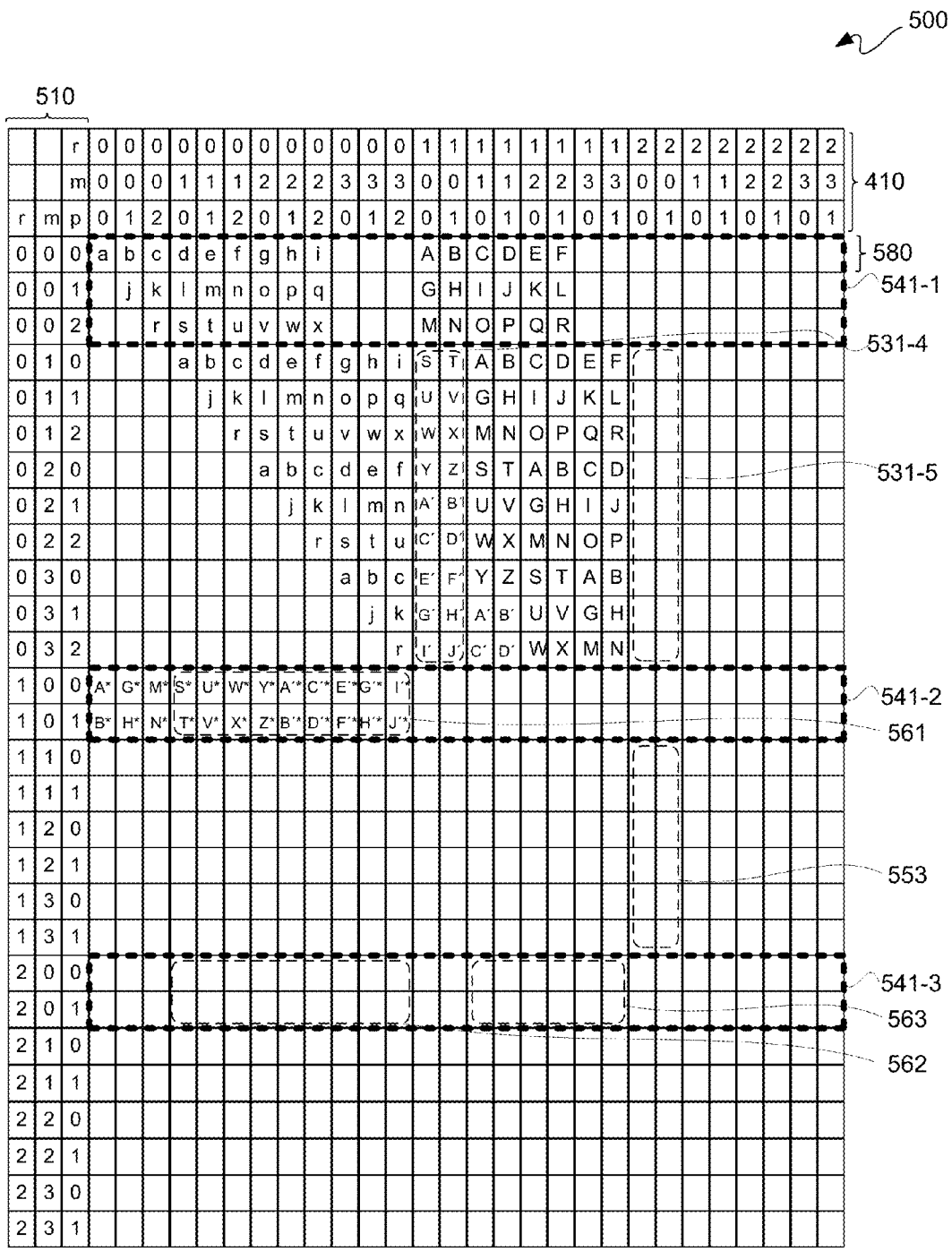
Figures 4, 5:
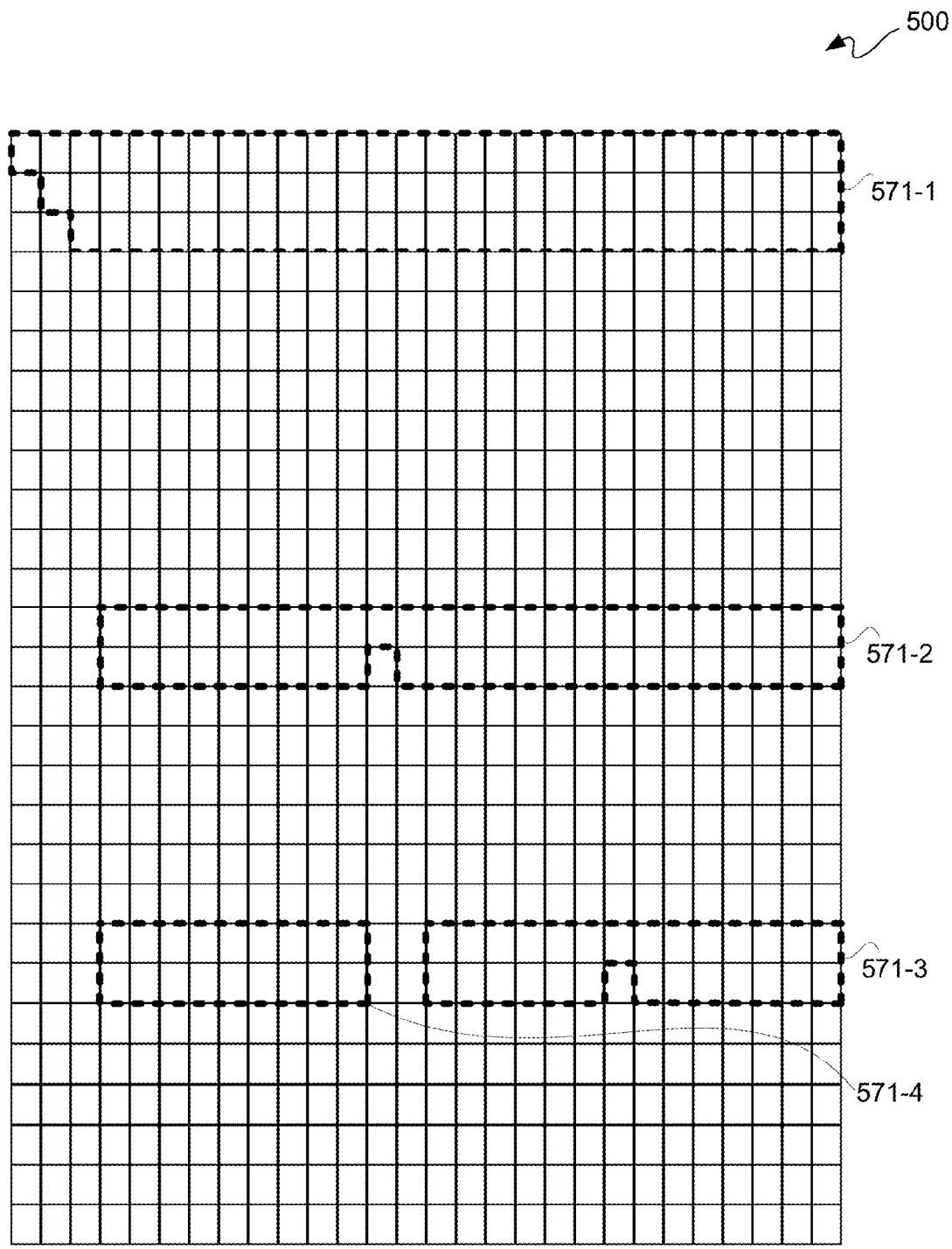

FIGS. 5-1 and 5-4 are table diagrams depicting respective formations of a matrix V 500 with associated determination regions. Matrices V 500 of FIGS. 5-1 through 5-2 may be thought of as in-process versions of a completed matrix V 228 of FIGS. 2 and 3. However, even though full matrices V 500 are illustratively depicted in FIGS. 5-1 through 5-2 for purposes of clarity to generally indicate movement of elements or values, such as from a lower triangular matrix 520 to an upper triangular matrix 530 for example in FIGS. 5-3 and 5-4, it shall be appreciated from the following description that some depicted rows of matrices V 500 are redundant. Along those lines, as described below in additional detail, generally only non-redundant elements or values for cells 501 of matrices V 500 may be used. Header rows 410 and header columns 510 are used for indicating parametric variables r, m, p, as previously described. Header rows 410 and header columns 510 do not form part of matrices V 500, but are shown to indicate indices for reasons previously described. In short, header rows 410 are transposed to provide header columns 510.

With continued reference to FIG. 5-1, as previously indicated, a bottom left triangular half or portion 520 of cells 501 of matrix V 500 may be determined from an upper right triangular half or portion 530 of cells 501 of matrix V 500 for a Hermitian matrix V 500, namely a Hermitian transpose. Accordingly, determination of values for cells 501 in portion 520 may be performed by determining values for cells 502 in portion 530 and then transposing and determining a conjugate or complex conjugate for each of such determined values.

However, not all values of cells 501 in portion 530 need to be determined in order to populate all cells in portion 520. Rather, only values for cells in dashed region 531, namely a determination region, may be calculated or otherwise determined, and other cells 501 in portion 530 outside of dashed region 531 may generally be copied from determined values of cells 501 within dashed region 531.

Again, for purposes of clarity by way of example and not limitation, alphabetic symbols have been used to identify values of cells and how those values may be redundant or repeated. However, not all cells 501 of matrix V 500 have been populated with symbols for purposes of clarity.

A set of values 502, namely a 3×2 grouping of cells 501, within dashed region 531 may be copied to corresponding locations of cells 501 outside of dashed region 531. Some of these locations, namely 3×2 locations 503, 504, and 505, are illustratively depicted for purposes of clarity by way of example and not limitation. Thus, because of redundancy within portion 530, only a set of cells 501 within dashed region 531 may be determined, and all cells 501 in portion 530 remaining, namely within portion 530 and outside of dashed region 531, may be obtained by copying and pasting determined values from such set of values of cells 501 within dashed region 531. Thus, all cells 501 in portion 530 may be populated with values. From values in cells 501 of portion 530, cells 501 in portion 520 may be populated with values by performing a Hermitian transpose as matrix V 500 is an Hermitian matrix. Along the above-described lines, a full matrix V 500 may be resolved. For example, all cells 501 in matrix V 500 may be populated with values.

For the example of FIG. 5-1, a conventional approach might involve storing $$\frac{28 \cdot (28 + 1)}{2} = 406$$

elements in memory for a matrix V. However, for matrix V 500, only elements or values in cells 501 in dashed region 531 may be stored, as all other cell elements or values for all remaining cells in matrix V 500 may be determined from such stored elements or values of cells 501 in dashed region 531.

While a grid or region defined by dashed region 531 may be reduced to an algorithm and/or a hardware addressing scheme, such a grid is not straight forward. Thus, even though updating overhead may be substantially reduced, defining dashed region 531 for determining which cells 501 to calculate or otherwise determine and store values adds some complexity.

To further reduce such complexity, a modified dashed region 531, namely a determination region, may be used. FIG. 5-2 is the table diagram of FIG. 5-1, though with a modified determination region formed of six discrete sections 531-1 through 531-6. In this example, sections 531-1 through 531-6 form a contiguous determination region. For a reduction in complexity some overhead is retained, as indicated by shaded cells 501. Shaded cells 501 are not needed for purposes of reconstructing a matrix V 228; however, values for such shaded cells 501 are determined as part of a less complicated geography or border for a determination region.

However, with reference to FIG. 5-3, another determination region may be defined formed of discrete well-defined dashed regions 541-1 through 541-3 in this example. This further simplification uses the Hermitian property of matrix V 500. Along those lines, vertical columns, such as sections 531-4 through 531-6 for example in FIG. 5-2 for example, are not considered for portions of a determination region formed of discrete non-contiguous sections 541-1 through 541-3, but instead complex conjugate portions, such as for example portions 561 through 563, in lower triangular portion 520 of matrix V 500 may be used to provide values for cells 501 respectively in sections 531-4 through 531-6, as generally indicated with some alphabetic symbols, where * denotes a complex conjugate. Thus, complex conjugate values in cells 501 of rows 580, namely rows where a memory parameter m equals 0, used to provide determination regions or sections may be used to provide complex values in cells 501 of rows outside of such determination regions. This copying, converting to complex form, and pasting may be done from generally a row orientation to a column orientation.

Using entire rows 580 to avoid columnar sections in a determination region may lead to a substantially more regular structure of elements, for example as compared with determination regions of FIGS. 5-1 and 5-2, as only certain selected rows 580 may have elements or values for cells 501 thereof to be calculated or otherwise determined. There may be some additional overhead associated with using complete rows for a determination region formed of complete row sections, such as sections 541-1 through 541-3 for example. Along those lines, FIG. 5-4 is FIG. 5-3 where sections 571-1 through 571-4 are tailored so as to have no cells 501 which are not needed for construction of a matrix V 228. Sections 571-1 and 571-2 correspond to sections 541-1 and 541-2 of FIG. 5-3, and sections 571-3 and 571-4 correspond to section 541-3 of FIG. 5-3.

The above examples of determination sections or regions are not meant to be every possible combination or configuration thereof. Rather, such examples are meant to describe some examples of determination sections or regions, and from such description, it should be apparent that many other combinations or configuration, including without limitation modification of the examples illustratively presented, may be used without departing from the scope of this disclosure.

With additional reference to FIG. 3 and continued reference to FIG. 5-3 for purposes of clarity by way of example and not limitation, after processing all samples, a complete matrix 500 may be reconstructed from those selected rows 580. Again, some elements or values are contained in more than one of rows 580, for example elements A, B, G, H, M and N in the example matrix of FIG. 5-3. While sections 571-1 through 571-4 are tailored to determine and store only those elements of a matrix 500 for purposes of efficiency with respect to such determination and storage, generally index checking involved in such a highly optimized matrix V computation or determination loop may be higher than any expected reduction in determination and/or storage overhead by omitting these elements or cells 501.

However, for a determination region or section with additional elements or cells 501, an additional difficulty is added with respect to determining which rows of matrix V are sufficient to compute or otherwise determine all other elements. As there are multiple solutions to this problem, an example of a solution is provided for purposes of clarity by way of example and not limitation. However, it should be appreciated any of a variety of solutions may be used without departing from the scope of this disclosure.

Figure 6:
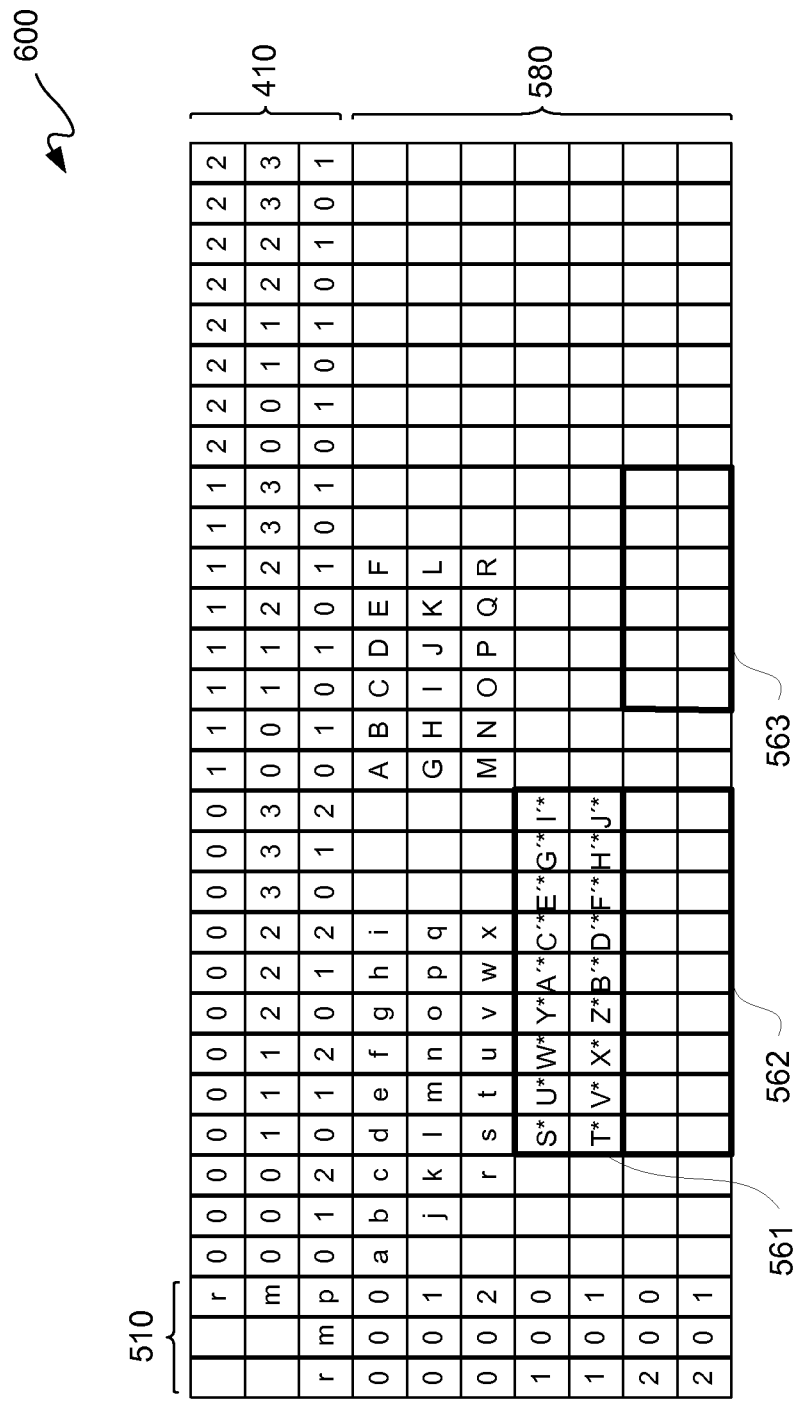
FIG. 6 is a table diagram depicting an exemplary compressed V matrix.

FIG. 6 is a table diagram depicting an exemplary compressed V matrix 600. Compressed V matrix 600 may be compressed V matrix 304 of FIG. 3. Along those lines, even though not all cells 501 of compressed V matrix 600 are illustratively depicted with symbols, all such cells 501 may be populated with some value, even if such value is left over from initialization. Thus, for example, compressed V matrix 600 may be, after all samples of a set of n samples have been processed for completely readying rows 580, used for reconstruction of a complete V matrix 307, as in FIG. 3. Again, headers 410 and 510 do not form part of compressed V matrix 600, but are illustratively depicted for purposes of clarity and not limitation. Determination portions 561 through 563 are identified for purposes of clarity.

A set of pivot rows K' ⊂ K may be defined which contain all rows for which a row with a memory parameter m decreased by one does not exist, namely rows 580 as m equals 0 for such rows. This condition may be mathematically expressed as:

$$K'=\{(r,m,p)\in K|(r,m-1,p)\text{ not}\in K\}. \quad (7)$$

Along those lines, a compressed or smaller V matrix 600 may be output that contains all values for all columns to provide a completed matrix V but only includes pivot rows 580 of such matrix V. Thus, pivot rows 580 may be identified by pivot row indices 323 of FIG. 3 for providing such compressed V matrix 600 or 304. Mathematically stated a matrix $V(k_x, k_y)$ with $k_x \in K$ and $k_y \in K'$ may be defined. For purposes of clarity, this (|K'|×l) matrix is hereinafter referred to as compressed matrix $\hat{V}$. Compressed matrix $\hat{V}$ in this example has 7 rows and 28 columns. At this point, it should be understood that by determining pivot rows 580, and then copying and pasting with some complex conjugating may be used to provide an original matrix V 228. Thus, in an example, only pivot rows are determined and stored to reduce update time of a parametric estimation, such as for estimator 205 of FIG. 2 and/or parametric estimation process 300 of FIG. 3.

Figure 7:
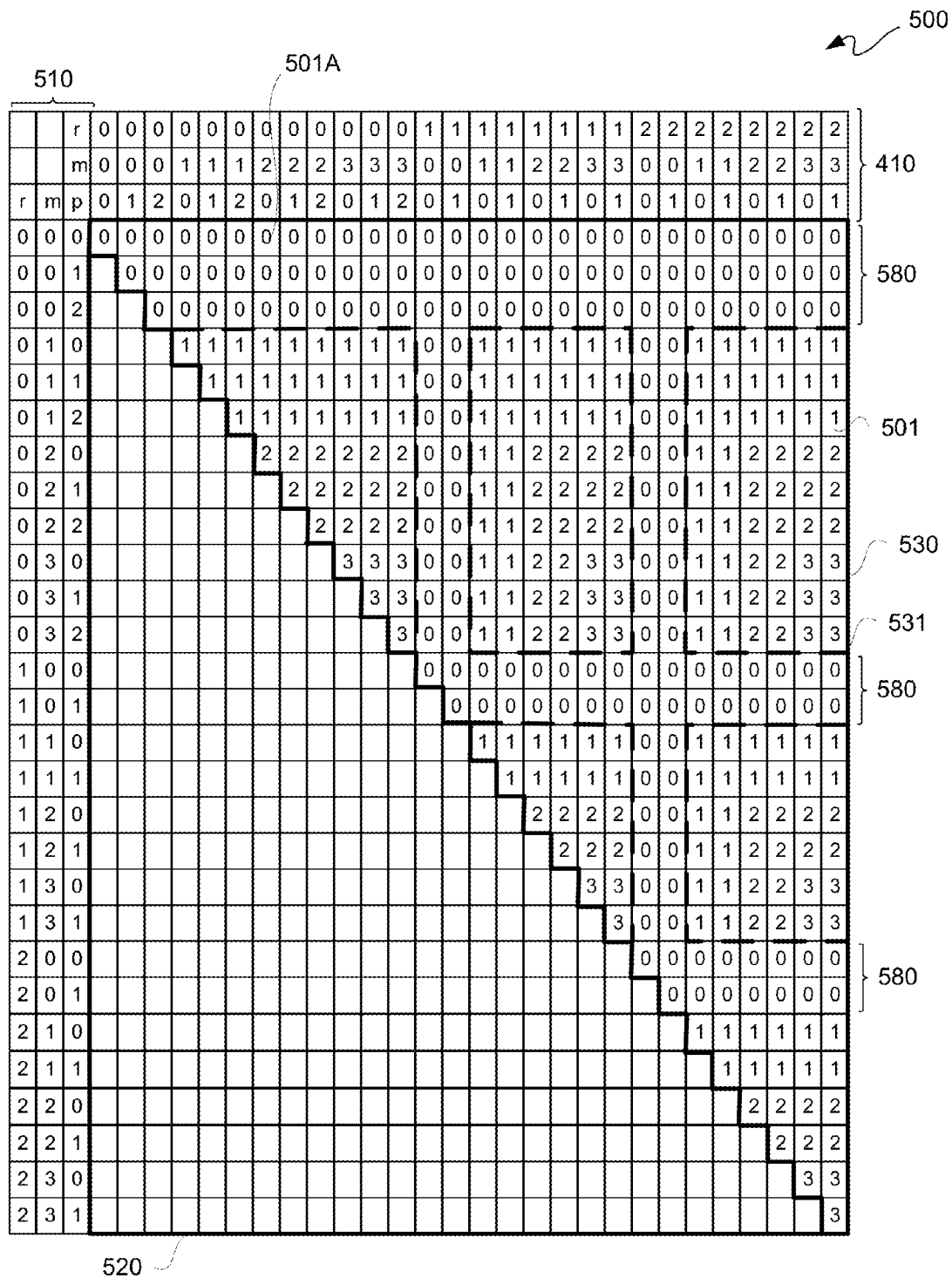
FIG. 7 is a table diagram depicting an exemplary completed upper right triangular matrix of an uncompressed matrix V.

Along those lines, FIG. 7 is a table diagram depicting an exemplary completed upper right triangular matrix 530 of an uncompressed matrix V 500. Once again, headers 410 and 510 do not form part of matrix V 500, but are illustratively depicted for purposes of clarity and not limitation. Additionally, values in cells 501 of matrix V 500, like parameters in headers 410 and 510, are provided for purposes of clarity by way of example and not limitation. Accordingly, these or other values for parameters and/or cells may be used. With respect to values in cells 501, these are delay factor q values for example memory parameters m, and not intended to be actual values for real samples of a PA output. Use of delay factor q values is described below in additional detail.

With renewed reference to FIG. 3 and continued reference to FIG. 7, uncompressed matrix 500 of FIG. 7 is further described. The size of an uncompressed matrix V 500 is (l×l). However, matrix V 500 is a Hermitian matrix, so for reconstruction at 306, it is sufficient to store only upper triangular matrix 530 of uncompressed matrix V 500. At reconstruction 306, such uncompressed matrix V 500, or more particularly upper triangular matrix 530, may be constructed from compressed V matrix 600 of FIG. 6, as described herein. While values for all cells 501 in pivot rows 580 may be determine in compressed V matrix 600, such values in lower left triangular matrix 520 are not illustratively depicted in matrix V 500 of FIG. 7. While a process may be used that does not perform a complete Hermitian transpose of upper right triangular matrix 530 with respect to complex conjugate values already determined in pivot rows 580, such process may be more complex than performing a complete Hermitian transpose of upper right triangular matrix 530. Thus, for purposes of clarity by way of example and not limitation, it shall be assumed that a complete Hermitian transpose of upper right triangular matrix 530 is used; even though, in other examples, a more tailored Hermitian transpose may be used.

For a complete Hermitian transpose of upper right triangular matrix 530, an amount of storage may be defined as:

$$\frac{l \cdot (l+1)}{2}.$$

For use of a compressed matrix $\hat{V}$, such amount of storage may generally be defined as:

$$|K'| \cdot l,$$

namely for a number of elements in such a compressed matrix $\hat{V}$.

Along those lines, a storage or memory savings may generally be mathematically defined as:

$$R = \frac{|K'| \cdot l}{\frac{l \cdot (l+1)}{2}} = \frac{2 \cdot |K'|}{l+1}. \quad (8)$$

For a situation where all indices with memory parameter m=0 belonging to a set of pivot rows and m∈{0, ..., M}, then |K'| is l/M. This means a storage or memory saving factor R in Equation (8) may simplify to R≈2/M. Thus, for every M>2, using a compression V matrix, such as compression V matrix 600 for example, for reconstruction at 306 may result in significant storage savings. Furthermore, runtime for determining matrix V 228 may generally grow linearly with the size of stored elements in such matrix V 228. Therefore, a runtime savings, such as a reduction in update time for parametric estimation, may be a similar factor to storage savings factor R.

Again, reconstruction at 306 of a complete V matrix 307 from a compressed matrix $\hat{V}$ may be simply copying an element for a given or selected or otherwise obtained index in matrix V 500 from a corresponding index in compressed matrix $\hat{V}$, such as compressed V matrix 600 for example. In instances where an element is copied from lower triangular matrix 520 to a cell in upper triangular matrix 530, a complex conjugation may be performed on such element before pasting into such cell, or vice versa. With a completed upper right triangular matrix 530 during reconstruction at 306, such reconstruction at 306 may perform a Hermitian transpose or complex conjugate on such completed upper right triangular matrix 530 to provide a completed lower left triangular matrix 520. Thus, with both triangular matrices 520 and 530 populated with values, a complete V matrix 307 may be output.

However, there may be some time difference between copied elements. Along those lines, a correction operation at 308 may be used to offset each time difference between copied elements. In other words, during accumulation of $V_t$, elements that have a non-zero delay factor q may be accumulated over an incorrect time interval. Generally, such elements should be accumulated in an interval [0, n]. However, due to copying, such elements may be accumulated in an interval [−q, n−q]. In order to offset this time difference, correction terms for intervals [−q, −1] and [n−q−1, n] may be added and subtracted, respectively. This addition and/or subtraction may be mathematically expressed as follows:

$$V(k_x, k_y) = \sum_{t=0}^{n} V_t(k_x, k_y)$$

$$= \sum_{t=0}^{n} V_{t-q}(k'_x, k'_y)$$

$$= \sum_{t=-q}^{n-q} V_t(k'_x, k'_y)$$

$$= V(k'_x, k'_y) + \sum_{t=-q}^{-1} V_t(k'_x, k'_y) - \sum_{t=n-q+1}^{n} V_t(k'_x, k'_y)$$

Generally, elements that have a non-zero delay factor q may have different row and column values parametric values r, m, p. As previously described, delay factors q for cells 501 of upper right triangular matrix 530 are illustratively depicted for matrix V 500 of FIG. 7. Such delay factors q are for associated exemplary row and column parameters r, m, p. So, for example, a non-zero delay factor q for cell 501A is 0. All cells 501 in determination region 531 have a zero valued delay factor q, and so no adjustment may be performed with respect to those cells 501. After reconstruction at 306, all elements with a non-zero delay factor q may be updated with correction terms, as described above, at 308, for output of a complete and corrected matrix V 228. Correction terms of delay factors q for lower left triangular matrix 520 follow from upper right triangular matrix 520 delay factors q.

Runtime for correction operations at 306 may be negligible in comparison to runtime savings obtained by using a compressed V matrix 304 to reconstruct a complete V matrix 307. In other words, a maximum value for q is much smaller than the number of rows n in a matrix U, and so runtime for correction at 306 may be negligible.

Reconstruction at 306 and correction at 308 may be performed once per update cycle of estimator 205 of FIG. 2. Thus, for example, reconstruction at 306 and correction at 308 need not be performed for every sample $y_0(n)$ 218 provided to estimator 205. Because reconstruction at 306 and correction at 308 may be performed a single time during an update cycle, computational or other overhead associated with such operations may be negligible.

Because an original V matrix 228 is still constructed at the end of parameter estimation process 300, memory allotment may be the same as without using a compressed V matrix 307. However, if computation or other determination at 303 of matrix V 228 is carried out in a hardware accelerator, such may include an FPGA and/or another IC with programmable resources, and reconstruction at 306 and correction 308 may be performed using a general-purpose processor or a microprocessor core or microprocessor cores with less expensive memory under software instructions. In other words, memory usage of a hardware accelerator for computation at 303 may be substantially reduced. As such a hardware accelerator may employ more expensive memory, such as BRAM for example, a reduction in such memory usage may be advantageous.

While the above description has been in terms of parameter estimation for DPD for purposes of clarity, such description should not be limited to DPD. For example, the above description may be applied to any matrix multiplications involving input matrices whose rows contain delayed values from previous rows. Furthermore, even though exploitation of U row redundancy was described, the above description applies to any redundancy in off-diagonal terms, namely where a parameter r is greater than 0.

Figure 8:
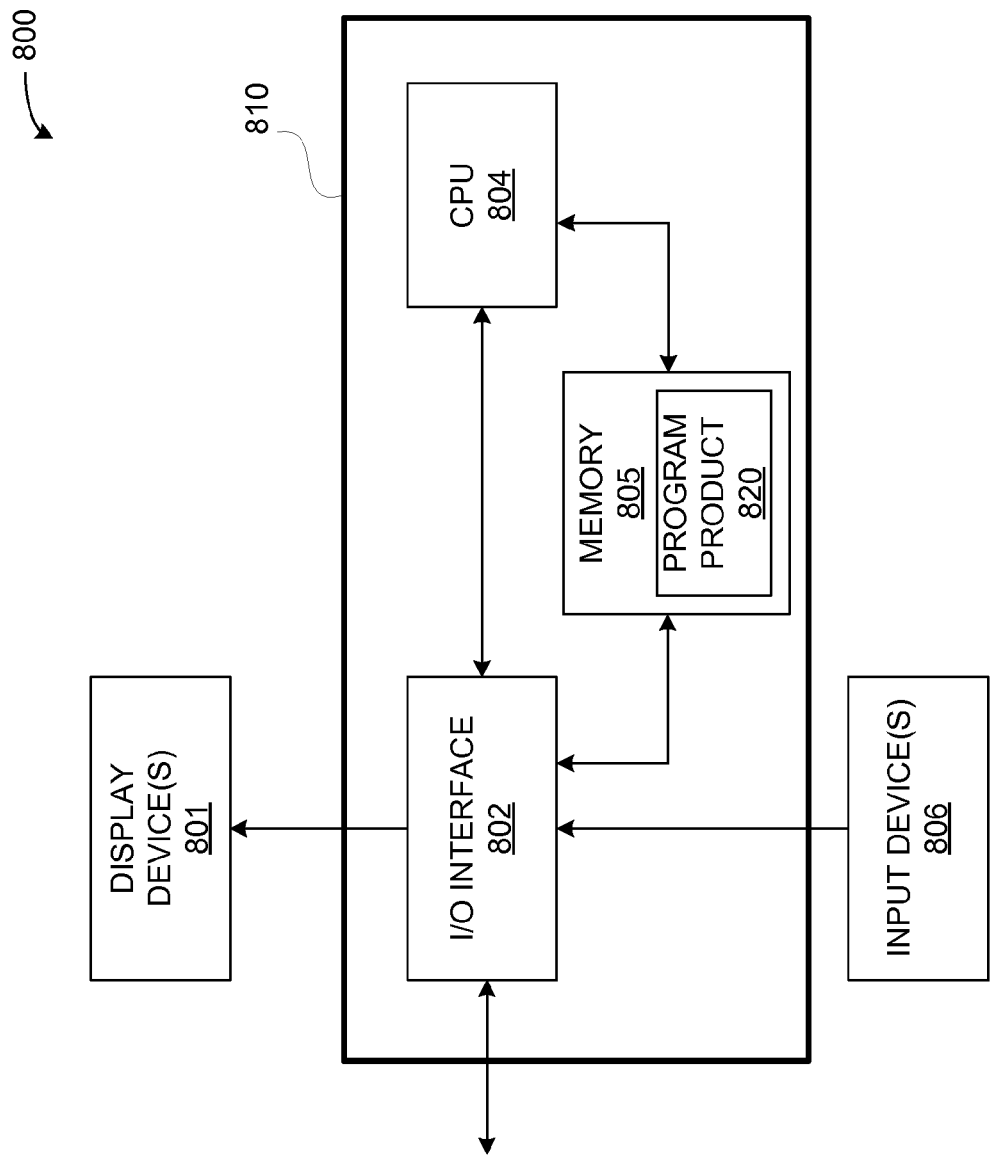
FIG. 8 is a block diagram depicting an exemplary computer system.

FIG. 8 is a block diagram depicting an exemplary computer system 800. Computer system 800 may include a programmed computer 810 coupled to one or more display devices 801, such as Cathode Ray Tube ("CRT") displays, plasma displays, Liquid Crystal Displays ("LCD"), projectors and to one or more input devices 806, such as a keyboard and a cursor pointing device. Other known configurations of a computer system may be used. Computer system 800 by itself or networked with one or more other computer systems 800 may provide an information handling system.

Programmed computer 810 may be programmed with a known operating system, which may be Mac OS, Java Virtual Machine, Real-Time OS Linux, Solaris, iOS, Android Linux-based OS, Unix, or a Windows operating system, among other known platforms. Programmed computer 810 includes a central processing unit (CPU) 804, memory 805, and an input/output ("I/O") interface 802. CPU 804 may be a type of microprocessor known in the art, such as available from IBM, Intel, ARM, and Advanced Micro Devices for example. Support circuits (not shown) may include cache, power supplies, clock circuits, data registers, and the like. Memory 805 may be directly coupled to CPU 804 or coupled through I/O interface 802. At least a portion of an operating system may be disposed in memory 805. Memory 805 may include one or more of the following: flash memory, random access memory, read only memory, magneto-resistive read/write memory, optical read/write memory, cache memory, magnetic read/write memory, and the like, as well as non-transitory signal-bearing media as described below.

I/O interface 802 may include chip set chips, graphics processors, and/or daughter cards, among other known circuits. An example of a daughter card may include a network interface card ("NIC"), a display interface card, a modem card, and a Universal Serial Bus ("USB") interface card, among other known circuits. Thus, I/O interface 802 may be coupled to a conventional keyboard, network, mouse, display printer, and interface circuitry adapted to receive and transmit data, such as data files and the like. Programmed computer 810 may be coupled to a number of client computers, server computers, or any combination thereof via a conventional network infrastructure, such as a company's Intranet and/or the Internet, for example, allowing distributed use for interface generation.

Memory 805 may store all or portions of one or more programs or data to implement processes in accordance with one or more examples hereof to provide program product 820. Additionally, those skilled in the art will appreciate that one or more examples hereof may be implemented in hardware, software, or a combination of hardware and software. Such implementations may include a number of processors or processor cores independently executing various programs and dedicated hardware or programmable hardware.

One or more program(s) of program product 820, as well as documents thereof, may define functions of examples hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD). The above examples specifically include information downloaded from the Internet and other networks. Such non-transitory signal-bearing media, when carrying computer-readable instructions that direct functions hereof, represent examples hereof.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
an analog-to-digital converter for converting an amplified signal from a power amplifier to input samples;
a parameter estimator coupled for receiving the input samples and configuration information;
the parameter estimator comprising:
a row determination block coupled to receive the input samples and the configuration information and configured to provide a row output for each of the input samples;
a matrix determination block coupled to receive the row output and the configuration information;
wherein the matrix determination block is configured to:
generate pivot row indices responsive to the configuration information;
generate each outer product using the row output and any of the pivot row indices therefor; and
accumulate, for each of the input samples, the outer product therefor for inclusion in a compressed matrix; and
a coefficient determination block coupled for receiving the compressed matrix for generating coefficients; and
a digital predistorter coupled for receiving the coefficients from the parameter estimator for outputting a predistorted signal for mitigating nonlinearity effects of the power amplifier.

2. The apparatus according to claim 1, wherein the matrix determination block, for each of the input samples, is configured to:
generate a Hermitian transpose of each row of the row output to provide a column;
wherein the row is for a sample of the input samples;
reduce a number of elements in either the row prior to generation of the Hermitian transpose or the column responsive to any of the pivot row indices therefor; and
multiply the column by the row to provide the outer product reduced in size responsive to the pivot row indices associated therewith.

3. The apparatus according to claim 2, wherein:
the matrix determination block is configured to accumulate the compressed matrix in increments of a matrix U(t) for t from 0 to n samples of the input samples for a sampling window; and
the matrix U(t) is a Volterra series matrix of the input samples.

4. The apparatus according to claim 2, wherein the configuration information includes parameter index arrays of a Volterra series.

5. The apparatus according to claim 4, wherein:
the pivot row indices correspond to memory terms of the parameter index arrays equal to zero; and
runtime for generating the compressed matrix by the parameter estimator is reduced to approximately $nl(l+1)/2$ for $l$ a dimension of the compressed matrix and n is for a number of samples of the Volterra series.

6. The apparatus according to claim 5, wherein the row determination block is configured to determine an element of the row according to:

$$U(t,k)=|y(t-m-r)|^P \cdot y(t-m),$$

wherein t is a row index of a matrix U;
wherein k is a first column index of the matrix U defined by r, m, p parameters of the configuration information; and
wherein the r, m, p parameters respectively represent diagonal/off-diagonal terms, memory terms, and polynomial contribution of the Volterra series.

7. The apparatus according to claim 6, wherein redundant elements of the matrix U are copied from row-to-row of the matrix U according to:

$$U(t,k)=U(t-q,k');$$

wherein k' is a second column index of the matrix U defined by the r, m, p parameters as well as a q parameter representing a delay factor.

8. The apparatus according to claim 1, wherein:
the matrix determination block is configured to construct a matrix V from the compressed matrix; and
the matrix V is an autocorrelation matrix;
the apparatus further comprises:
 a digital-to-analog converter for converting the predistorted signal to an analog signal;
 the digital predistorter for receiving an input signal for predistorting into the predistorted signal using the coefficients for the mitigating of the nonlinearity effects of the power amplifier; and
 the power amplifier for amplifying the analog signal to provide the amplified signal.

9. The apparatus according to claim 8, wherein the matrix determination block is configured to:
copy first values in the compressed matrix to corresponding first cells in the matrix V; and
obtain complex conjugates of second values in the compressed matrix and copy the complex conjugates to corresponding second cells in the matrix V.

10. The apparatus according to claim 9, wherein the matrix determination block is configured to:
populate the first cells and the second cells to provide a first triangular matrix of the matrix V;
obtain a complex conjugate of the first triangular matrix to generate a second triangular matrix of the matrix V; and
correct non-zero delay factors in the matrix V.

11. A method, comprising:
obtaining configuration information by a parameter estimator coupled to a power amplifier and a digital predistorter;
converting an amplified signal from the power amplifier to input samples with an analog-to-digital converter;
receiving the input samples by the parameter estimator;
with the parameter estimator:
 generating row outputs respectively for the input samples;
 determining pivot row indices from the configuration information;
 generating conjugates of the row outputs to provide columns;
 selecting pivot elements, from either the row outputs prior to generation of the conjugates or the columns responsive to the pivot row indices associated therewith, to constitute each of the columns;
 multiplying the columns respectively with the row outputs associated therewith to provide outer products for inclusion in a compressed matrix;
 assembling the compressed matrix with the outer products;
 reconstructing a V matrix from the compressed matrix;
 correcting non-zero delay factors in the V matrix to provide a matrix V;
 determining predistortion coefficients using the matrix V; and
 outputting the predistortion coefficients to the digital predistorter; and
outputting a predistorted signal by the digital predistorter for mitigating nonlinearity effects of the power amplifier.

12. The method according to claim 11, wherein the assembling comprises:
generating an outer product for each of the input samples on a sample-by-sample basis to provide the outer products; and
accumulating each of the outer products to provide the compressed matrix.

13. The method according to claim 12, wherein:
the generating of the conjugates comprises obtaining a Hermitian transpose for each row of the row outputs on the sample-by-sample basis to provide each column of the columns on the sample-by-sample basis; and
the selecting of pivot elements to constitute each of the columns associated therewith is performed on a row-by-row basis for each of the row outputs prior to generation of the conjugates responsive to the pivot row indices associated therewith to reduce size of the multiplying.

14. The method according to claim 12, wherein:
accumulation of the compressed matrix is in increments of a matrix U(t) for t from 0 to n samples of the input samples for a sampling window; and
the matrix U(t) is a Volterra series matrix of the input samples.

15. The method according to claim 12, wherein the configuration information comprises parameter index arrays of a Volterra series.

16. The method according to claim 15, wherein:
the pivot row indices correspond to memory terms of the parameter index arrays equal to zero; and
runtime for generating the compressed matrix by the parameter estimator is reduced to approximately nl(l+1)/2 for l a dimension of the compressed matrix and n is for a number of samples of the Volterra series.

17. The method according to claim 16, wherein the generating of the row outputs further comprises determining an element of the row according to:

$$U(t,k)=|y(t-m-r)|^P \cdot y(t-m),$$

wherein t is a row index of a matrix U;
wherein k is a first column index of the matrix U defined by r, m, p parameters of the configuration information; and
wherein the r, m, p parameters respectively represent diagonal/off-diagonal terms, memory terms, and polynomial contribution of the Volterra series.

18. The method according to claim 17, wherein:
redundant elements are copied from row-to-row of the matrix U according to:

$$U(t,k)=U(t-q,k');$$

wherein k' is a second column index of the matrix U defined by the r, m, p parameters as well as a q parameter representing a delay factor.

19. The method according to claim 11, wherein the reconstructing comprises:

copying first values in the compressed matrix to corresponding first cells in the V matrix;
obtaining complex conjugates of second values in the compressed matrix; and
copying the complex conjugates to corresponding second cells in the V matrix;
wherein the matrix V is an autocorrelation matrix.

20. The method according to claim 19, wherein:
the reconstructing further comprises:
populating the first cells and the second cells to provide a first triangular matrix of the V matrix;
obtaining a complex conjugate of the first triangular matrix to generate a second triangular matrix of the V matrix; and
the method further comprises predistortinq an input signal by the digital predistorter using the predistortion coefficients to provide the predistorted signal for the mitigating of the nonlinearity effects of the power amplifier.

* * * * *